United States Patent
Micheloni et al.

(10) Patent No.: US 9,305,661 B2
(45) Date of Patent: Apr. 5, 2016

(54) NONVOLATILE MEMORY SYSTEM THAT USES PROGRAMMING TIME TO REDUCE BIT ERRORS

(71) Applicant: PMC-SIERRA US, INC., Sunnyvale, CA (US)

(72) Inventors: Rino Micheloni, Turate (IT); Luca Crippa, Busnago (IT)

(73) Assignee: Microsemi Storage Solutions (U.S.), Inc., Wilmington, DE (US)

( * ) Notice: Subject to any disclaimer, the term of this patent is extended or adjusted under 35 U.S.C. 154(b) by 0 days.

(21) Appl. No.: 14/475,757

(22) Filed: Sep. 3, 2014

(65) Prior Publication Data
US 2016/0064096 A1    Mar. 3, 2016

(51) Int. Cl.
*G11C 16/34* (2006.01)
*G11C 16/10* (2006.01)
*G11C 16/32* (2006.01)

(52) U.S. Cl.
CPC .............. *G11C 16/349* (2013.01); *G11C 16/10* (2013.01); *G11C 16/32* (2013.01)

(58) Field of Classification Search
CPC ................. G11C 16/349; G11C 16/10; G11C 29/56004; G11C 2029/5606; G11C 2029/5602; G11C 29/56
USPC ...................................................... 365/185.12
See application file for complete search history.

(56) References Cited

U.S. PATENT DOCUMENTS

| | | | | |
|---|---|---|---|---|
| 7,567,472 B2* | 7/2009 | Gatzemeier | ...... | G11C 29/50012 365/201 |
| 8,094,508 B2* | 1/2012 | Gatzemeier | ............ | G11C 29/34 365/201 |
| 8,958,247 B2* | 2/2015 | Asaoka | .................. | G11C 16/06 365/185.17 |
| 2007/0136628 A1* | 6/2007 | Doi | ........................ | G11C 29/56 714/718 |
| 2009/0290441 A1* | 11/2009 | Gatzemeier | ...... | G11C 29/50012 365/201 |
| 2014/0085982 A1* | 3/2014 | Asaoka | .................. | G11C 16/06 365/185.17 |
| 2014/0198581 A1* | 7/2014 | Kim | .................... | G11C 16/3459 365/185.22 |

* cited by examiner

*Primary Examiner* — Richard Elms
*Assistant Examiner* — Xiaochun L Chen
(74) *Attorney, Agent, or Firm* — Kenneth Glass; Glass & Associates (57) ABSTRACT

A nonvolatile memory system and a method for using programming time to reduce bit errors in the nonvolatile memory system are disclosed. The method includes programming a plurality of memory cells of a nonvolatile memory device, identifying weak cells using programming time and preventing subsequent programming to the identified weak cells.

22 Claims, 9 Drawing Sheets

FIG. 11

NONVOLATILE MEMORY SYSTEM THAT USES PROGRAMMING TIME TO REDUCE BIT ERRORS

BACKGROUND

NAND-based flash memories are widely used as the solid-state memory storage due to their compactness, low power consumption, low cost, high data throughput and reliability. Solid state drive (SSD) devices commonly employ NAND-based flash memory chips and a flash controller to manage the flash memory and to transfer data between the flash memory and a host computer.

An issue for SSDs is the reliability of the storage elements over the life of the SSD. Over time, relatively high gate voltages applied to the storage elements during program and erase (P/E) cycles in the SSD may cause cumulative permanent changes to the storage element characteristics. Charge may become trapped in the gate oxide of the storage elements through stress-induced leakage current (SILC). As the charge accumulates, the effect of programming or erasing a storage element becomes less reliable and the overall endurance of the storage element decreases. Additionally, an increasing number of P/E cycles experienced by a storage element decreases the storage element's data retention capacity, as high voltage stress causes charge to be lost from the storage element's floating gate, resulting in increased Bit Error Rate (BER) of the memory storage device.

SSDs manage errors by retiring blocks when either a program or an erase operation of the block fails. Once a read or erase operation in a block fails, all readable data in the block is moved to storage locations in good blocks and the block is retired. This is typically done by marking the block as a "bad block" by indicating the address of the block in a bad block table. One problem with this approach is that a block can be good and then become uncorrectable before the following operation. For example, this could occur during retention.

Accordingly, what is needed in the art is a system and method that will decrease the BER of individual NAND-based flash memory chips and the overall BER of the data storage device. Also, a method and apparatus is needed that will reduce the number of failures during retention and that will reduce the number of uncorrectable bit errors.

SUMMARY

In various embodiments, a nonvolatile memory system is disclosed that includes a nonvolatile memory storage module for storing encoded data and a nonvolatile memory controller. The nonvolatile memory storage module includes a plurality of memory cells that are controlled by the nonvolatile memory controller.

A nonvolatile memory controller is disclosed that is configured to be coupled to a plurality of NAND devices, and operable to perform a program operation on memory cells of a NAND device of the plurality of NAND devices, to determine the programming time indicated by the NAND device being programmed, to identify weak memory cells based on the determined programming time, and to prevent subsequent programming to the weak memory cells.

A method for using programming time to reduce bit errors in a nonvolatile memory system is disclosed that includes programming a plurality of memory cells of a nonvolatile memory device, identifying weak memory cells of the plurality of programmed memory cells using programming time and preventing subsequent programming to the identified weak memory cells.

In accordance with one embodiment programming to blocks including memory cells identified as weak cells is prevented. In another embodiment, programming to pages containing memory cells identified as weak cells is prevented. When the nonvolatile memory system includes an interleaved architecture, programming is prevented to all pages associated with the wordline of the memory cells identified as weak cells (paired pages). More particularly, programming is prevented to the page containing memory cells identified as weak cells and any page paired to the page containing the memory cells identified as weak memory cells.

The method and apparatus of the present invention, by preventing subsequent programming to pages or blocks containing memory cells identified as weak cells, prevents these subsequent pass disturbs and high-voltage program disturbs that would result from programming weak cells, reducing the bit error rate and the uncorrectable error rate of the nonvolatile memory system.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
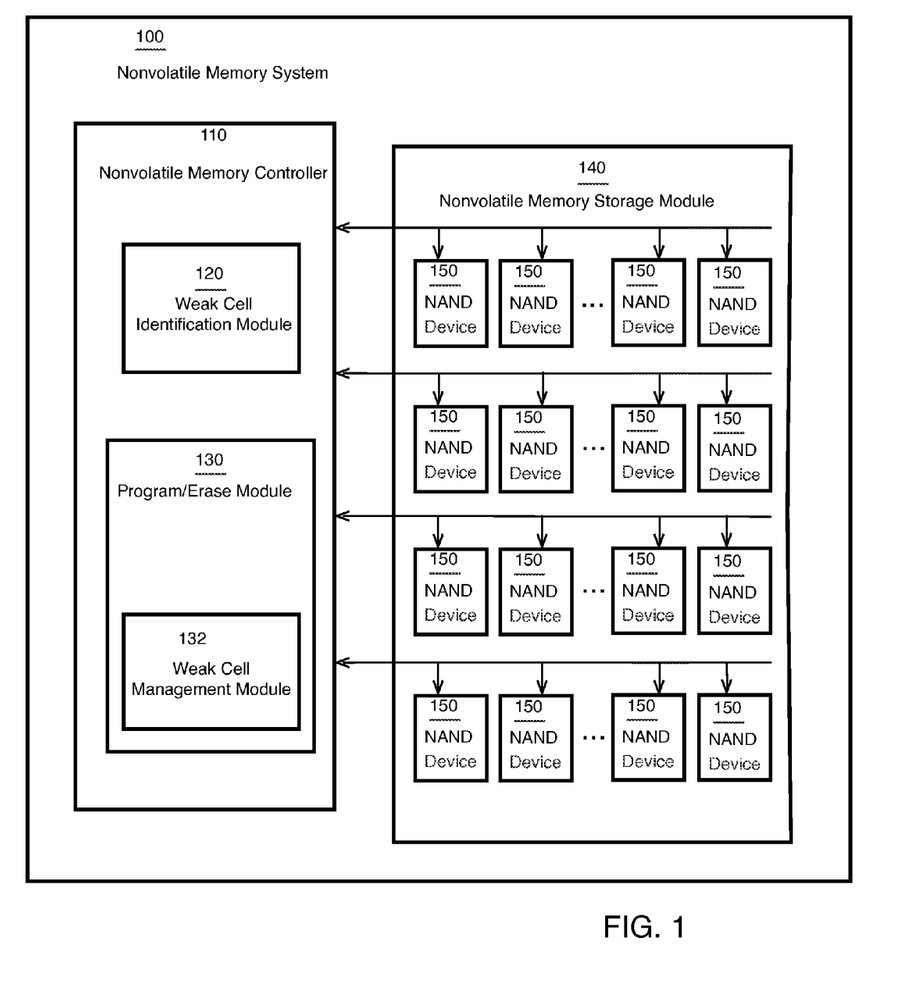
FIG. 1 is a block diagram illustrating a nonvolatile memory system in accordance with an embodiment of the present invention.

A nonvolatile memory system 100 is shown in FIG. 1 to include a nonvolatile memory controller 110 in communication with a nonvolatile memory storage module 140. The nonvolatile memory storage module 140 includes a plurality of nonvolatile memory devices for storing data. In the present embodiment the nonvolatile memory devices are NAND devices 150. In the present embodiment each NAND device 150 is a packaged semiconductor die that is coupled to nonvolatile memory controller 110 by conductive pathways that couple instructions, data and other information between each NAND device 150 and nonvolatile memory controller 110. The nonvolatile memory controller 110 includes a weak cell identification module 120 and a program/erase module 130 coupled to the weak cell identification module 120. Program/erase module 130 includes a weak cell management module 132 and a wear leveling module 133.

In one exemplary embodiment each NAND device 150 is coupled to nonvolatile memory controller 110 by chip enable line (CE#), a command latch enable (CLE) line, a read enable signal line (RE#), an address latch enable (ALE) signal line, a write enable single line (WE#), a read/busy (RB) signal line and input and output (I/O) signal lines.

Figure 2:
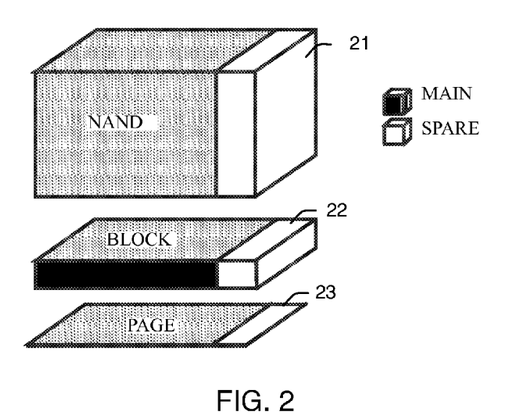
FIG. 2 is block diagram illustrating a memory logic organization in accordance with an embodiment of the present invention.

Referring now to FIG. 2, each NAND device 21 includes memory cells that are organized into blocks 22 and pages 23, with each block 22 composed of NAND strings that share the same group of word lines. A logical page 23 is composed of cells belonging to the same word line. The number of logical pages 23 within logical block 22 is typically a multiple of 16 (e.g. 64, 128). Each logical page 23 is composed of a main data area and a spare area. The main data area may have the size of 4 kB, 8 kB, 16 kB or larger. The spare area is made up of hundreds of bytes for every 4 kB of main data storage area.

In the present embodiment, a logical page 23 is the smallest addressable unit for reading from and writing to the NAND memory and a logical block 22 is the smallest erasable unit. However, it is appreciated that in embodiments of the present invention programming to less than an entire page may be possible, depending on the structure of the NAND array.

Program/Erase module 130 is operable to check for bad blocks prior to writing to memory blocks in each NAND device 150. Bad blocks are indicated by a manufacturer of each NAND device 150 in the form of one or more bad block table that is stored in the spare area of NAND device 150. In the present embodiment the bad block table for each NAND device 150 is stored in the spare area of either in the first good block of each NAND device 150 or the last good block of each NAND device 150. One or more mirrored bad block tables can also be stored in nonvolatile memory system 100, such as, for example, in one or more of NAND devices 150. When a program or erase operation fails during the operation of the nonvolatile memory system, the NAND device 150 reports the failure by updating a status register that indicates bad blocks. The data in the block that experienced the failure is written to a good block and the bad block tables are updated to prevent future programming operations from programming to the bad block.

Figure 3:
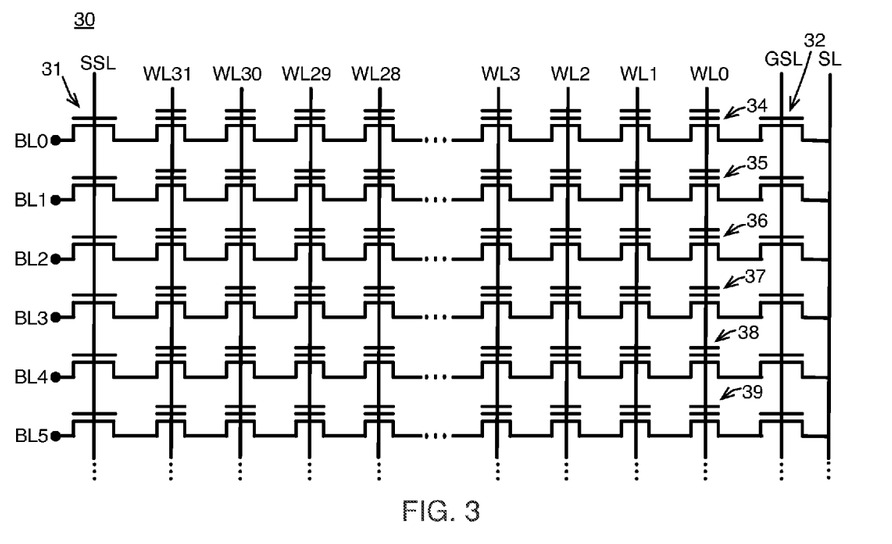
FIG. 3 is a diagram illustrating a NAND array in accordance with an embodiment of the present invention.

An exemplary NAND array 30 is shown in FIG. 3 that is made of memory cells connected in series to form NAND strings. Each NAND string is isolated from the rest of the array by select transistors, such as, for example, select transistor 31 and select transistor 32. Multiple memory cells share the gate voltage (Vg) through a word line, and the drain of one memory cell is the source of the adjacent one. For example, memory cells 34-39 of FIG. 3 share word line 0 (WL0). Though FIG. 2 illustrates an embodiment in which memory cells are single level cells, it is appreciated that NAND devices 150 can also be multi-level cell NAND devices and can store, for example, 2 bits per cell, 3 bits per cell or 4 bits per cell.

Figure 4:
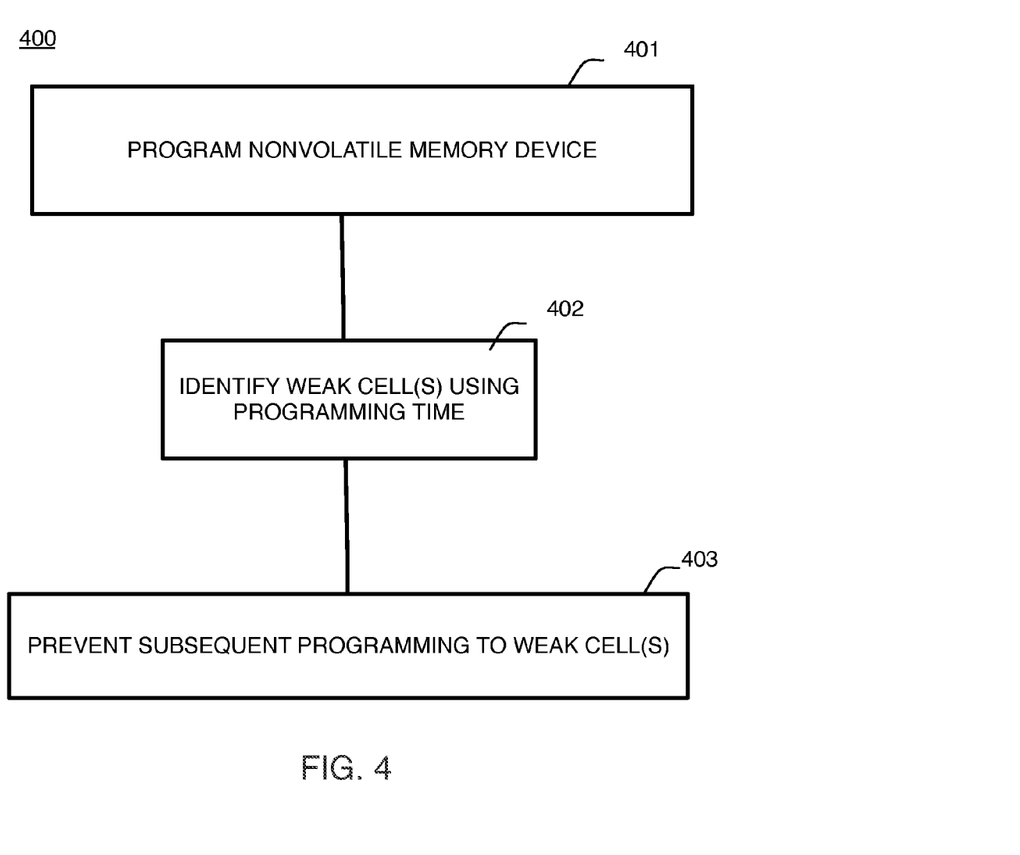
FIG. 4 is a flow diagram illustrating a method for using programming time to reduce bit errors in accordance with the present invention.

FIG. 4 illustrates a method 400 that includes programming a nonvolatile memory device as shown by step 401. In the present embodiment a page 23 of NAND-based flash memory is programmed. In the embodiment shown in FIG. 1, nonvolatile memory controller 110 is operable to program a page 23 of a NAND device 150 by sending instructions to the NAND device 150 that includes the data to be programmed into the page 23 of NAND device 150.

Figure 5:
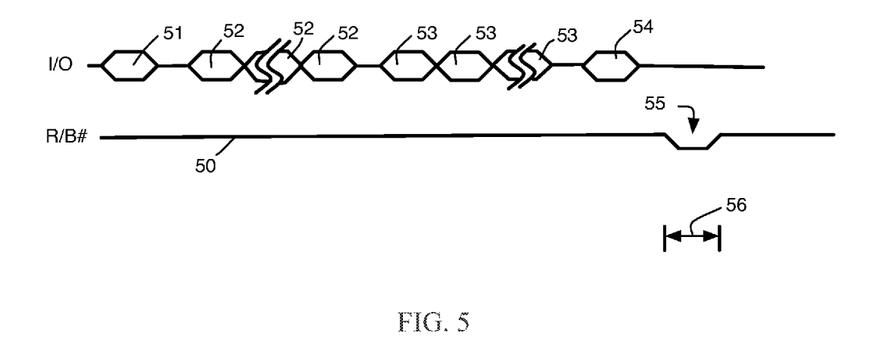
FIG. 5 is a graphical illustration of input to a NAND device on Input and output lines and corresponding output from a NAND device on a read/busy line for performing a programming operation on the NAND device in accordance with an embodiment of the present invention.

In the embodiment shown in FIG. 5, program/erase module 130 is operable to communicate with NAND devices 150 so as to perform a program operation on memory cells in a NAND device 150 by sending, with CLE asserted, a program page command 51 to the NAND device 150 to be programmed. With ALE asserted, addresses 52 are input, followed by inputting data 53 to the register. When all of the data 53 has been input, a PROGRAM command 54 is issued to confirm the previous program page command 51 and start the programming operation. During the programming, the read/busy line (R/B#) is asserted 55 by the NAND device 150 being programmed.

To program a cell, the addressed wordline is biased at a high voltage (e.g., 16V to 24V). The addressed bitline is biased at ground and are therefore exposed to electron injection in case the gate is raised to a high voltage. A self-boost mechanism is used to prevent unwanted programming on unselected bitlines. More particularly, DSL transistors on each of the unselected wordlines are OFF, leaving the bulk of the connected NAND string free to couple with a pass Voltage ($V_{pass}$). In the embodiment shown in FIG. 3, for example, to program cell 34, all of the unselected wordlines WL1-WL31 are raised to $V_{pass}$ thereby avoiding unwanted programming on unselected bitlines WL1-WL31, the addressed bitline BL0 is biased at ground and a high program voltage $V_{sel}$ is applied to the addressed bitline BL0.

The $V_{pass}$ applied to the unselected wordlines can result in electrons being injected into the floating gates of memory cells along the addressed bitline other than the memory cell 34 to be programmed. This effect is commonly referred to as a "pass disturb" and can result in the unintended programming of memory cells on the selected bitline BL0 other than the memory cell 34 to be programmed. When cell 34 is programmed, memory cells 34-39 are also subject to the $V_{sel}$ applied to program memory cell 34. This results in unintended electrons being injected into the floating gates of memory cells 34-39 in the programmed wordline WL0, which can be referred to as a "program disturb." Program disturbs can result in the unintended programming of memory cells 35-39 on the selected wordline other than the memory cell 34 being programmed. The impact of program and pass disturbs results in bit errors and leads to uncorrectable bit errors in the NAND array 30. Moreover, oxide degradation causes the effects on individual memory cells to increase as the memory cells age, resulting in more errors over time.

Figure 6:
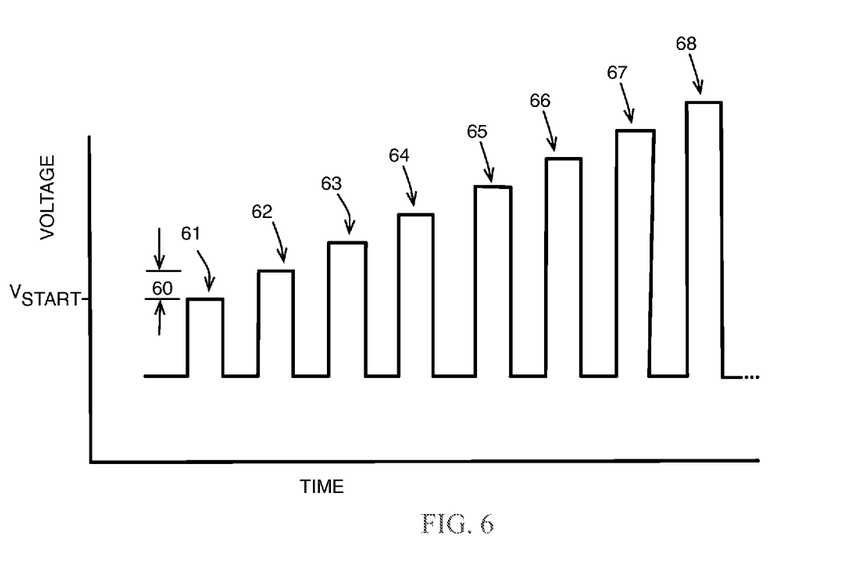
FIG. 6 is a flow diagram illustrating exemplary program pulses used to program a NAND cell in accordance with an embodiment of the invention.

In the present embodiment NAND devices 150 program memory cells by applying a staircase voltage to the addressed wordline. More particularly the programming operation is a sequence of programming pulses such as exemplary program pulses 61-68 shown in FIG. 6. The programming operation starts the program pulses at a programming Voltage ($V_{SEL}$)

equal to a predetermined starting program voltage (Vstart) and applying a page program pulse having the programming voltage $V_{SEL}$ to each cell to be programmed. A page program verify operation is performed to determine whether or not all of the cells are programmed. In the present embodiment the page program verify operation is determined to be successful if all cells to be programmed on the page have reached a target threshold voltage (Vt). Subsequent program pulses are applied with increasing programming voltages $V_{SEL}$ until programming is successful on all the cells on the page that are to be programmed. The voltage of each program pulse is incremented by a voltage increment ($\Delta V_{PP}$) 60 until either the programming is successful or the number of pulses (K) has exceeded a pulse threshold ($K_{MAX}$) in which the programming operation is stopped and is determined to fail. When a program fail occurs a program fail indication is provided to nonvolatile memory controller 110.

In the present embodiment the programming operation of step 401 programs an entire page (e.g., logical page 23) of a NAND device 150. However, it is appreciated that, alternatively, the programming of step 401 can be the programming of a number of bits less than a logical page 23 as will be discussed hereinafter.

Referring to step 402, weak cells are identified using programming time. In the embodiment shown in FIG. 1, weak cell identification module 120 is operable for identifying weak cells based on the programming time indicated by the NAND device 150 being programmed in step 401. Programming time is a time that is indicative of the time required for completing the programming operation.

In the embodiment shown in FIG. 5, each NAND device 150 is operable to generate a busy signal 55 that indicates the time required for completing the programming operation (e.g., a page programming operation). In the present embodiment, this time period, shown as time period 56 in FIG. 5, is the programming time that is used to identify weak cells in step 402.

Figure 7:
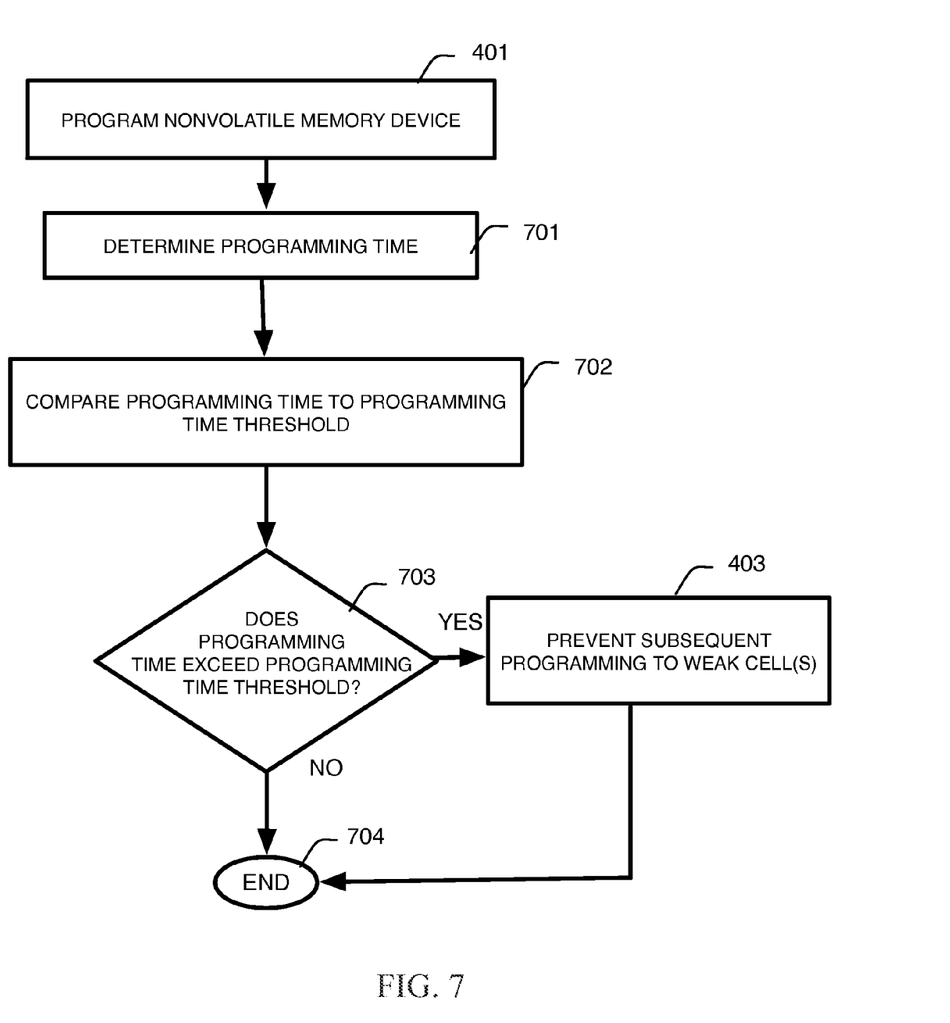
FIG. 7 is a flow diagram illustrating a method for using programming time to reduce bit errors that uses programming time threshold to identify weak cells in accordance with an embodiment of the invention.

In the embodiment shown in FIG. 7, weak cells are identified, as shown by steps 701-703, using a programming time threshold. First, as shown by step 710 programming time is determined. In the embodiment shown in FIG. 1, weak cell identification module 120 is operable for monitoring control signal line 65, starting a timer when busy signal 55 is received and stopping the timer when busy signal 55 is deasserted to determine the programming time 56 indicated by the NAND device 150 being programmed. It is appreciated that the programming time 56 measured by weak cell identification module 120 may vary from the actual programming time 56 based on the accuracy of the measurement and calculation of the timing in weak cell identification module 120.

As shown by step 703 the determined programming time 56 is compared to a programming time threshold. In one embodiment, weak cell identification module 120 is operable for comparing the programming time determined in step 701 to the programming time threshold. In the present embodiment the programming time threshold is a predetermined value that is stored in nonvolatile memory system 100, such as, for example in a NAND device 150.

As long as the determined programming time does not exceed the programming time threshold, the process ends as shown by step 704 with the successful programming of the memory page. However, if the programming time 56 is determined to exceed the programming time threshold in step 703, the programmed memory cells include one or more "weak cells" and subsequent programming to these cells, is prevented as shown by step 403. More particularly, subsequent programming to all cells programmed in step 401 (the "programmed cells") is prevented when test of step 703 indicates that the programmed cells include one or more weak cell.

Figure 8:
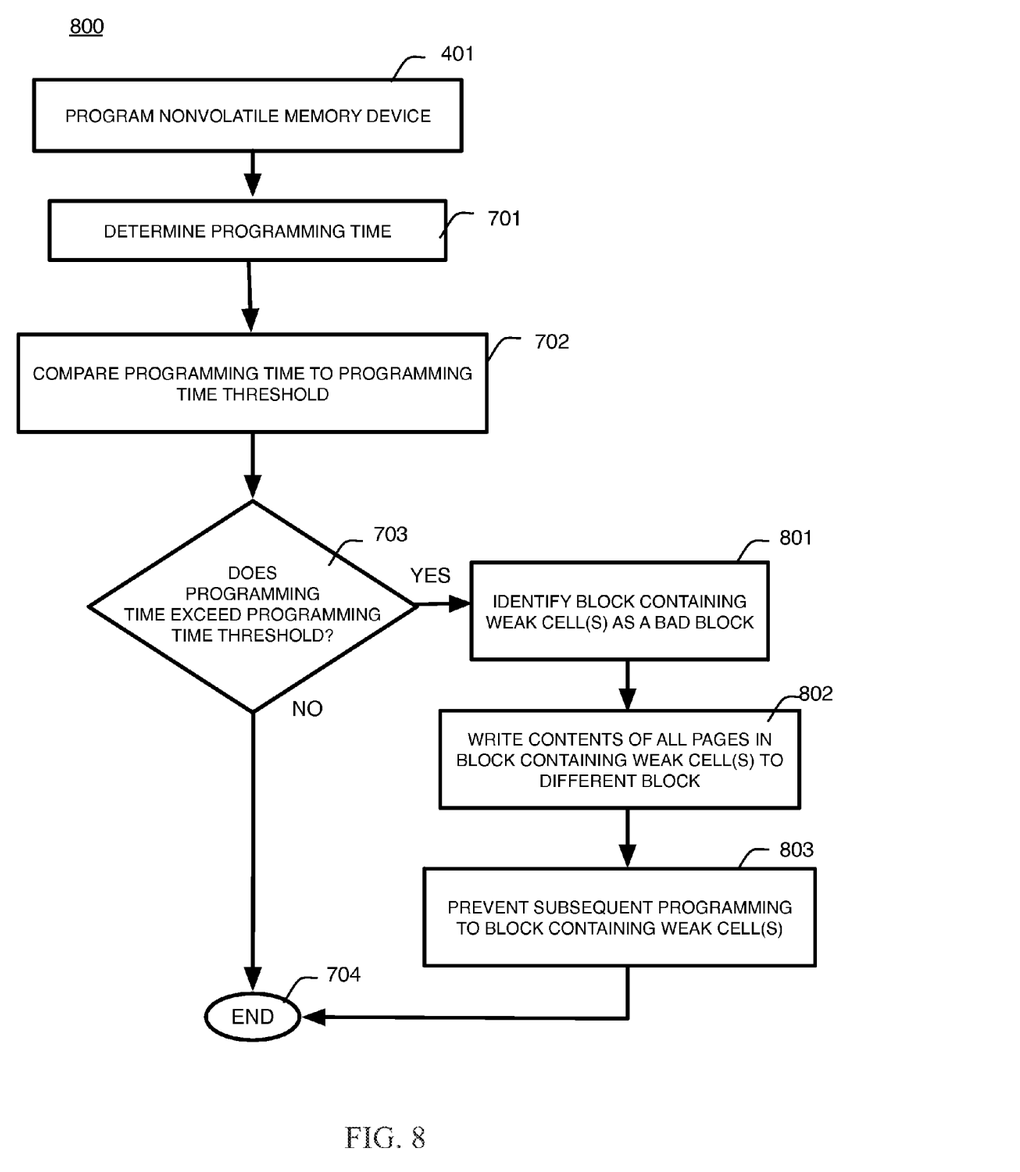
FIG. 8 is a flow diagram illustrating a method for using programming time to reduce bit errors in which programming to weak cells is prevented by identifying the block containing the weak cell as a bad block in accordance with an embodiment of the invention.

In the embodiment shown in FIG. 8, subsequent programming to the one or more weak cells is prevented by marking the block containing the weak cells as a bad block as shown by step 801. This can be done, for example by updating the one or more bad block table to include the address (or the block number) of the block that was programmed in step 401. In the embodiment shown in FIG. 1, weak cell management module 132 is operable to mark the block containing the weak cells as a bad block by updating one or more bad block table or one or more status register that indicates bad blocks.

All of the data in the block that includes the one or more weak cells is written to a different block as shown by step 802 and subsequent programming to the block containing the one or more weak cells is prevented as shown by step 803. In the present embodiment the conventional bad block management procedures and circuitry of program/erase module 130 are used for performing steps 802-803. In this embodiment, weak cell management module 132 is operable for writing all of the data in the block that that was written to in step 401 to a different block and preventing subsequent programming to the block containing the one or more weak cells by checking either one or more bad block table or a bad block status register prior to each programming step 401 and not programming to any block that is indicated to be a bad block.

Figure 9:
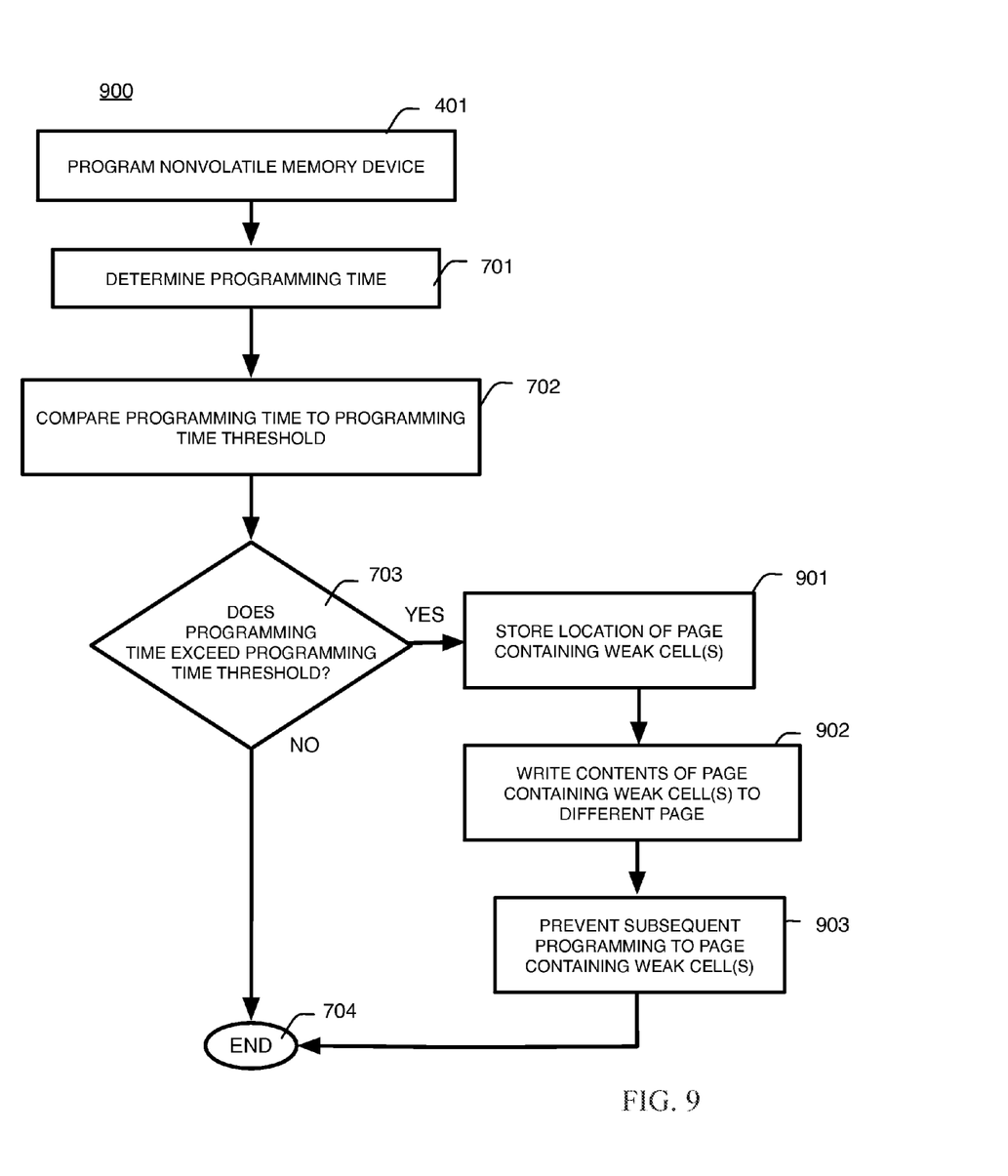
FIG. 9 is a flow diagram illustrating a method for using programming time to reduce bit errors in which programming to weak cells is prevented by preventing subsequent programming of the page containing the weak cell in accordance with an embodiment of the invention.

In the embodiment shown in FIG. 9, subsequent programming of the one or more weak cells is prevented by preventing programming to the page containing the one or more weak cells. As shown by step 901, the location of the page containing the one or more weak cells is stored. In the embodiment shown in FIG. 1 weak cell management module 132 is operable for storing, on nonvolatile memory storage module 140, the location of the page that was written to in step 401. This page will include the one or more weak cells. In the present embodiment a weak-cell-page lookup table is stored in the spare area of each of of NAND-chips 150. In addition, one or more additional weak-page lookup table, such as one or more mirrored table, is also stored in nonvolatile memory storage module 140. The weak-page lookup table indicates the location of each page determined to contain a weak cell, and can include the page number and block number of the weak cell.

In one embodiment, in addition to storing the page number and block number of each weak cell, weak cell management module 120 is operable for storing the word line and bit line of the weak cell for use in error management diagnostics.

As shown by step 902 the data on the page containing the weak cell is copied to a different page. Then, as shown by step 903 subsequent programming to the page containing the weak cell is prevented. In the present embodiment program/erase module 130 is operable for checking the one or more weak-cell-page lookup table prior to each subsequent program operation 401, and does not program to any page identified in the weak-cell-page lookup table. Thus, data will continue to be programmed to all of the pages of the block containing the weak cell except for the page containing the weak cell.

In one embodiment nonvolatile memory system 100 has an interleaved architecture in which each wordline is associated with more than one page, such as an interleaved architecture in which even and odd cells of the wordline are associated with different pages. In this embodiment, programming is prevented to all of the pages associated with the wordline of the identified weak memory cells. More particularly, programming is prevented to the page containing the cells identified as weak cells and any page paired to the page containing the cells identified as weak cells.

In one specific embodiment having an interleaved architecture, the location of all of the pages associated with the wordline that includes the cells identified as weak cells are stored in step 901 and the contents of all of the pages associated with the wordline containing one or more weak cells are written to different pages in step 902. Subsequent programming to all of the pages associated with the wordline containing the one or more weak cells is prevented as shown by step 903. Thereby, programming to the page containing the one or more weak cells is prevented and programming to any page that is paired to the page containing the one or more weak cells is prevented.

When a programming operation 401 exceeds the programming time threshold in step 703, it indicates that one or more cells are "weak" and require programming pulses over the number of program pulses corresponding to the programming time threshold. Because NAND devices 150 program memory cells by applying a staircase voltage to the addressed wordline, when the programming time exceeds the programming time threshold, the extra programming pulses that are applied in order to program the one or more weak cell are applied at a high voltage level. The resulting program disturbs are at the high voltage levels of these extra programming pulses, significantly increasing the likelihood of a raw bit errors and uncorrectable bit errors. Moreover, the likelihood of raw bit errors and uncorrectable bit errors increases over time, increasing the likelihood that a weak cell will cause an uncorrectable bit error during retention. The method and apparatus of the present invention, by preventing subsequent programming to pages or blocks containing memory cells identified as weak cells, prevents these subsequent high-voltage program disturbs that would have resulted from programming weak cells, reducing the bit error rate and the uncorrectable error rate of the nonvolatile memory system.

The threshold voltage of a NAND cell changes during the lifetime of the device. Given the same biasing conditions (e.g., 23V and 100 microseconds) the resulting Vth increases with the number of cycles. Accordingly, as the NAND device gets older it is easier to program but harder to erase. This is taken into account when selecting a programming time threshold, allowing for selection of a programming time threshold that will result in a given number of cells being identified as weak cells, and the easier programming decreasing the likelihood that a significant number of additional cells will be identified as weak cells as the NAND device ages.

Figure 10:
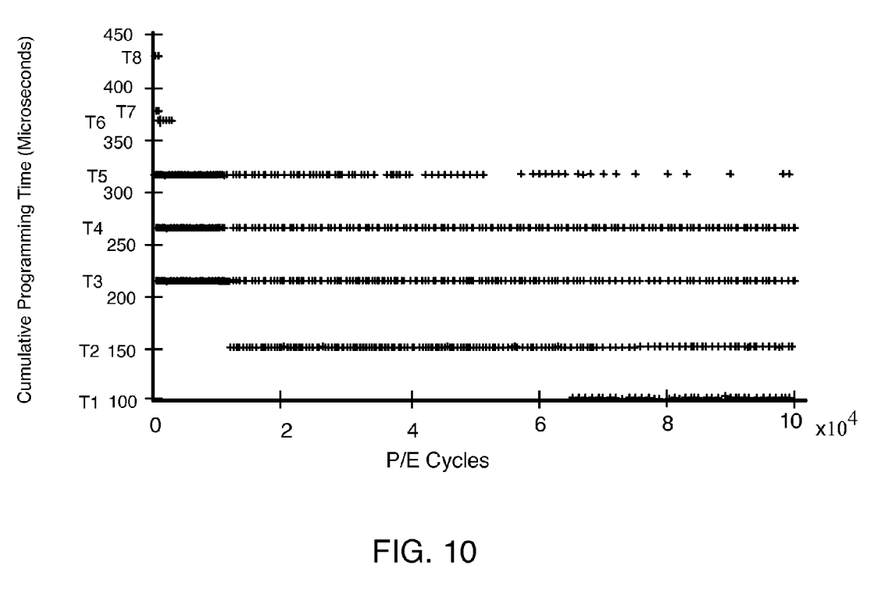
FIG. 10 is a graph illustrating cumulative programming time for a single level cell NAND device over 100,000 program and erase (P/E) cycles that is used for determining a programming time threshold in accordance with an embodiment of the invention.

In one embodiment that is illustrated in FIG. 10, programming time threshold is determined by analyzing the characteristics of one or more NAND chip 150. In this embodiment, one or more test NAND chip is analyzed to determine the programming times corresponding to different staircase voltage levels over a range of Program and Erase (P/E) cycles, and selecting a programming time threshold based on the determined programming times corresponding to different staircase voltage levels. In the embodiment shown in FIG. 10 a single level cell NAND device having a program time specification of 450 microseconds is tested to a total of $10 \times 10^4$ P/E cycles at ambient temperature. The tested NAND device is shown to exhibit eight distinct cumulative programming times, shown as T1-T8.

At the beginning of the test the highest programming times of T8 (435 microseconds), T7 (375 microseconds) and T6 (364 microseconds) are measured and programming time is shown to decrease over the NAND device's life, with no occurrences of the higher programming times T6-T8 after the first 10,000 P/E cycles. At the beginning of the life of the tested NAND device programming time T5 (320 microseconds) occurs, but as the number of P/E cycles increases, fewer occurrences of cumulative programming time T5 are measured. During the first 20,000 P/E cycles, most programming operations have a cumulative programming time T3 (216 microseconds), a cumulative programming time T4 (264 microseconds) or cumulative programming time T5. Also, the faster programming times T1 (100 microseconds) and T2 (150 microseconds) do not occur until after 10,000 P/E cycles, with T1 not achieved until after 60,000 P/E cycles.

Following is an example of the selection of a programming time threshold using the ambient temperature test results of FIG. 10. In one embodiment the programming time threshold is selected as a programming time that is between a programming time T4 and programming time T5. The programming time threshold may be the average of programming time T4 and T5 (e.g., 292 microseconds) such that it falls in the middle of programming times T4 and T5. In this embodiment programming operations that have programming time exceeding 292 microseconds (T5, T6, T7 and T8) are identified as including one or more weak cells and programming operations having a programming time less than 292 microseconds (T1-T4) are not determined to include one or more weak cell.

It is appreciated that programming time varies with temperature of the NAND device being programmed. At higher temperatures, and after the first thousand P/E cycles, cumulative programming times generally decrease. Accordingly, the programming time threshold chosen at ambient temperature will result in a certain number of cells being classified as weak cells, increased temperature will not result in additional cells being classified as weak cells as the effects of increased temperature and increased numbers of P/E cycles tends to reduce cumulative programming time. Accordingly, when a programming time threshold is chosen, the number of memory cells that will be removed from the available memory cell pool can be ascertained, and that number will not significantly vary as the NAND device ages.

In another example, a lower programming time threshold can be chosen, reducing the memory available for storing data but resulting in a nonvolatile memory system with lower bit error rate and faster programming. For example, a programming time threshold that is between a cumulative programming time T4 and cumulative programming time T3. This could be the average of cumulative programming time T4 and T3 that is shown to be approximately 240 microseconds in FIG. 10.

In one embodiment of the present invention, the programming time threshold is programmable, with the nonvolatile memory controller operable to receive input indicating the programming time threshold. In another embodiment, several different programming time thresholds are available to be chosen by the user. In one specific embodiment, the user can chose either a first programming time threshold (e.g., 292 microseconds) that is between a first measured cumulative programming time T5 and a second, lower measured programming time T4 or a second programming time (e.g., 240 microseconds) that is between measured programming T4 and a lower measured programming time T3.

In the present embodiment, the blocks or pages withdrawn from the available memory pool because they are identified as including weak cells can be referred to hereinafter as the "weak-cell data storage area" and the remainder of the data storage area available for storing data can be referred to as the "primary data storage area" that includes active blocks and active pages. Active blocks are all blocks not marked as bad blocks, and active pages are all pages that are not in blocks identified as bad blocks and that are not identified as including weak cells and withdrawn from the pool of memory available for storing data in step 903. Thus, incoming data to be stored in nonvolatile memory system 100 is stored in active pages of active blocks, and includes both the main data storage area and the spare data storage area shown in FIG. 2.

Though the methods and apparatus of the present invention remove blocks or pages from the pool of memory available for storing data and thus reduce the primary data storage area, the number of NAND devices 150 can be increased to compensate, resulting in a nonvolatile memory device 100 having a low bit error rate and fast programming time.

Figure 11:
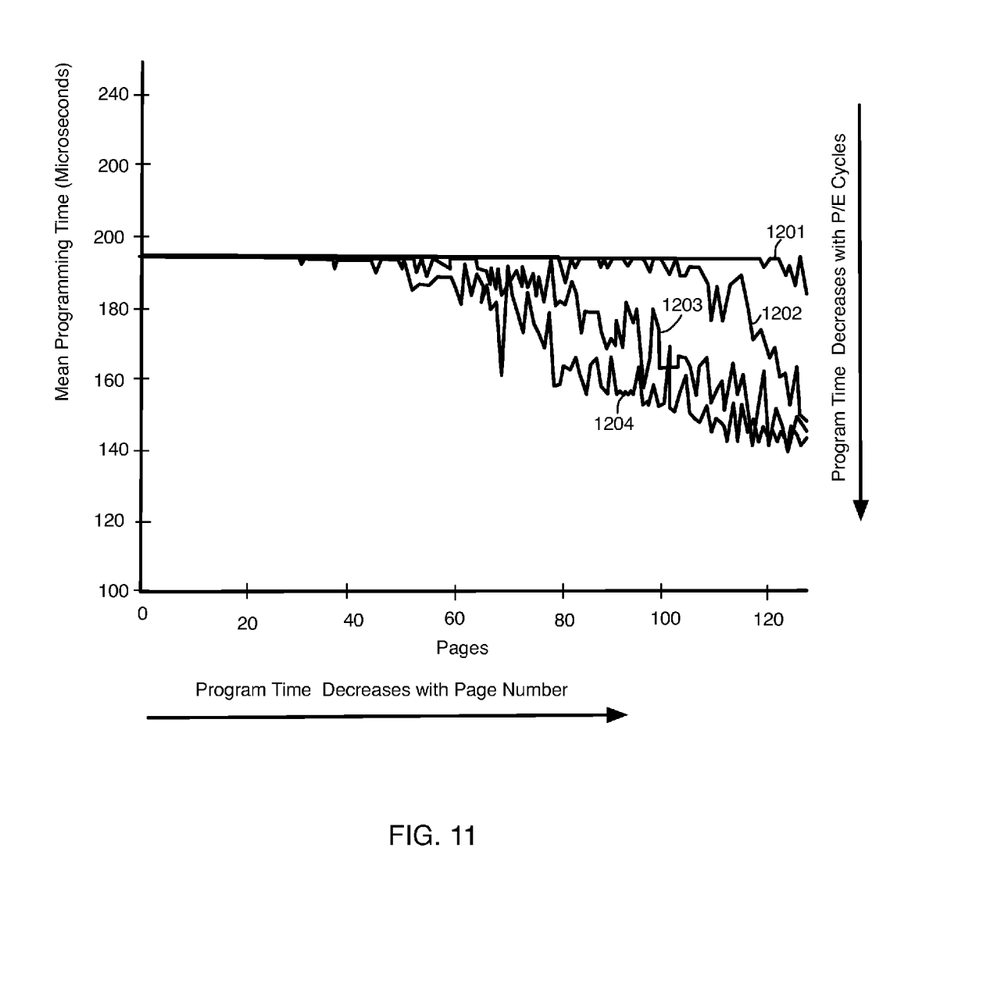
FIG. 11 is a graph illustrating mean programming time at ninety degrees centigrade after 50,000 program and erase cycles, after 100,000 program and erase cycles, after 150,000 program and erase cycles after 200,000 program and erase cycles in accordance with an embodiment of the invention.

Program time decreases with page number as is illustrated in FIG. 11. In the example shown in FIG. 11, mean program time after 5,000 P/E cycles is illustrated by curve 1201, mean program time after 10,000 P/E cycles is illustrated by curve 1202, mean program after 15,000 cycles is illustrated by curve 1203 and mean program time after 20,000 P/E cycles is illustrated by curve 1204. In addition, as the number of P/E cycles increases, this effect becomes more pronounced, with pages having a higher page number having a lower programming time than those having a lower page number.

In one embodiment, the speed of nonvolatile memory system 100 is further increased by removing pages of each block having a low page number from the pool of active pages. In one specific embodiment this is done by adding pages having a low page number to the pages identified as containing weak memory cells. For example, a predetermined number of pages (e.g., the first forty pages of each active block) are indicated to be weak pages and programming to these pages is prevented. This can be done by adding the predetermined number of pages to the weak-page lookup table, such that subsequent programming to these pages is prevented. Since programming time decreases with page number and program time decreases as the number of P/E cycles increases, this provides a nonvolatile memory system with a faster programming time. In the present embodiment the memory controller is programmable and allows for programming of the predetermined number of pages having a low page number that are to be withdrawn from the active pages. The programming can either be by providing an input value that indicates the predetermined number of pages having a low page number that are to be withdrawn from the active pages or by the user selection of one of a plurality of different predetermined numbers of pages having a low page number that are to be withdrawn from the active pages (e.g., 10, 20, 30 or 40 pages). Thereby, nonvolatile memory controller 110 can be programmed to accommodate for varying levels of capacity of NAND devices 150 and desired programming time.

Nonvolatile Dual Inline Memory Modules (NV-DIMM) and Nonvolatile Random Access Memory (NV-RAM) applications are designed to allow for to recovery from an unexpected power down. The data values and instructions that are required for recovery from unexpected power down, are referred to hereinafter as "recovery data." However, this type of event is a rare event. Thus, the portion of the memory allocated to recovery will not experience many P/E cycles. In one embodiment recovery data is stored in pages having a low page number so that pages having a high page number will be available for storing incoming data, resulting in additional increase to programming speed. For example, the first ten available pages of each block can be reserved for recovery data. Accordingly, if the predetermined number of pages having a low page number that are to be withdrawn from the active pages is 40 pages, and if the next ten pages are reserved for recovery data, the blocks available for storing incoming data will have higher page numbers, providing decreased programming time as the NAND device ages.

In various embodiments, the system of the present invention may be implemented in a Field Programmable Gate Array (FPGA) or Application Specific Integrated Circuit (ASIC).

Though the method and apparatus of the present invention is described above with respect to a single level memory cell, it is within the scope of the present invention to extend the methods and apparatus of the present invention to MLC (multiple-level cell) devices, as would be evident to one of skill in the art. In this embodiment, the memory cells of NAND devices 150 are multi-level cells and the steps of FIGS. 4 and 7-8 are performed using multi-level cells.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for using programming time to reduce bit errors in a nonvolatile memory system, the method comprising:
   programming a plurality of memory cells of a nonvolatile memory device;
   dentifying weak memory cells of the programmed memory cells using programming time;
   indicating, in a weak-page lookup table, pages containing an identified weak memory cell; and
   preventing subsequent programming to the pages indicated in the weak-page lookup table.

2. The method of claim 1 wherein the nonvolatile memory system is a NAND-based flash memory system that includes a plurality of NAND devices, the programming a plurality of memory cells comprising programming a plurality of memory cells of a NAND device of the plurality of NAND devices.

3. The method of claim 2 wherein the identifying weak memory cells further comprises monitoring an output of a NAND device being programmed to determine the programming time indicated by the NAND device being programmed.

4. The method of claim 3 wherein the NAND device being programmed is operable to generate a busy signal, the nonvolatile memory system including a timer that is coupled to the NAND device being programmed, the timer started when the busy signal is asserted and stopped when the busy signal is deasserted to determine the programming time indicated by the NAND device being programmed.

5. The method of claim 4 wherein the identifying weak memory cells comprises comparing the determined programming time to a programming time threshold, the programmed memory cells identified to be weak memory cells when the determined programming time exceeds the programming time threshold.

6. The method of claim 1 wherein preventing subsequent programming to the pages in the weak-page lookup table further comprises preventing subsequent programming to pages paired to the pages containing an identified weak memory cell.

7. The method of claim 1 wherein the data in the page containing the weak memory cell is moved to a different page, the weak-page lookup table used for preventing subsequent programming to the identified weak memory cells.

8. A nonvolatile memory controller configured to be coupled to a plurality of NAND devices, and operable to perform a program operation on memory cells of a NAND device of the plurality of NAND devices, to determine the programming time indicated by the NAND device being programmed, to identify weak memory cells based on the determined programming time, to indicate pages containing an identified weak memory cell in a weak-page lookup table, and prevent subsequent programming to the pages indicated in the weak-page lookup table.

9. The nonvolatile memory controller of claim 8 further comprising a weak cell identification module that is operable for monitoring an output of the NAND device being programmed to determine the programming time indicated by the NAND device being programmed.

10. The nonvolatile memory controller of claim 9 wherein the weak cell identification module includes a timer that is coupled to the NAND device being programmed, the timer started when a busy signal is asserted and stopped when a busy signal is deasserted to determine the programming time indicated by the NAND device being programmed.

11. The nonvolatile memory controller of claim 9 wherein the weak cell identification module is operable to compare the determined programming time to a programming time threshold, the programmed memory cells identified to be weak memory cells when the determined programming time exceeds the programming time threshold.

12. The nonvolatile memory controller of claim 11 wherein subsequent programming is prevented to any page paired to a page containing an identified weak memory cell.

13. The nonvolatile memory controller of claim 8 wherein the memory controller is operable to move the data in the page containing the weak memory cell to a different page.

14. A nonvolatile memory system comprising:
a plurality of NAND devices;
a memory controller coupled to each of the NAND devices, the memory controller operable to perform a program operation on memory cells of a NAND device of the plurality of NAND devices, the memory controller including a weak cell identification module that is operable to determine the programming time indicated by the NAND device being programmed, to identify weak memory cells by comparing the determined programming time to a programming time threshold, the programmed memory cells identified to be weak memory cells when the determined programming time exceeds the programming time threshold, to indicate pages containing an identified weak memory cell in a weak-page lookup table, and the memory controller operable to prevent subsequent programming to the pages indicated in the weak-page lookup table.

15. The nonvolatile memory system of claim 14 wherein the NAND device being programmed is operable to generate a busy signal, the memory controller including a timer that is coupled to the NAND device being programmed, the timer started when the busy signal is asserted and stopped when the busy signal is deasserted to determine the programming time indicated by the NAND device being programmed.

16. The nonvolatile memory system of claim 14 wherein subsequent programming is prevented to any page paired to a page containing an identified weak memory cell.

17. The nonvolatile memory system of claim 16 wherein the nonvolatile memory controller is operable to move the data in the page containing the weak memory cell to a different page.

18. The nonvolatile memory system of claim 17 wherein a predetermined number of pages having a low page number of each block not identified as a bad block are included in the weak-page lookup table.

19. The nonvolatile memory system of claim 18 wherein recovery data is stored in pages having a low page number of each block not identified as a bad block.

20. A nonvolatile memory system comprising:
a plurality of NAND devices;
a memory controller coupled to each of the NAND devices, the memory controller operable to perform a program operation on memory cells of a NAND device of the plurality of NAND devices, the memory controller including a weak cell identification module that is operable to determine the programming time indicated by the NAND device being programmed, to identify weak memory cells by comparing the determined programming time to a programming time threshold, the programmed memory cells identified to be weak memory cells when the determined programming time exceeds the programming time threshold, to indicate pages containing an identified weak memory cell in a weak-page lookup table, and the memory controller operable to subsequently store only recovery data in pages indicated in the weak-page lookup table.

21. A nonvolatile memory controller configured to be coupled to a plurality of NAND devices, and operable to perform a program operation on memory cells of a NAND device of the plurality of NAND devices, to indicate pages having a low page number in each block of a NAND device of the plurality of NAND devices in a weak-page lookup table, and prevent subsequent programming to the pages indicated in the weak-page lookup table.

22. The nonvolatile memory controller of claim 21 wherein the nonvolatile memory controller is further configured to determine the programming time indicated by the NAND device being programmed, to identify weak memory cells based on the determined programming time, and to indicate pages containing an identified weak memory cell in the weak-page lookup table.

* * * * *